(12) United States Patent
Goeke (10) Patent No.: US 11,853,089 B2
(45) Date of Patent: Dec. 26, 2023

(54) EXPANDED SHUNT CURRENT SOURCE

(71) Applicant: Keithley Instruments, LLC, Solon, OH (US)

(72) Inventor: Wayne C. Goeke, Hudson, OH (US)

(73) Assignee: Keithley Instruments, LLC, Solon, OH (US)

( * ) Notice: Subject to any disclaimer, the term of this patent is extended or adjusted under 35 U.S.C. 154(b) by 115 days.

(21) Appl. No.: 16/937,338

(22) Filed: Jul. 23, 2020

(65) Prior Publication Data

US 2021/0026386 A1    Jan. 28, 2021

Related U.S. Application Data

(60) Provisional application No. 62/878,613, filed on Jul. 25, 2019.

(51) Int. Cl.
*G05F 1/575* (2006.01)
*G01R 1/20* (2006.01)

(52) U.S. Cl.
CPC ............ *G05F 1/575* (2013.01); *G01R 1/20* (2013.01)

(58) Field of Classification Search
CPC ..................................................... G05F 1/561
USPC ........................................................ 327/103
See application file for complete search history.

(56) References Cited

U.S. PATENT DOCUMENTS

| | | | | |
|---|---|---|---|---|
| 4,290,024 A | * | 9/1981 | Yokoyama | H03F 1/56 330/105 |
| 5,296,866 A | * | 3/1994 | Sutton | H01Q 7/00 343/856 |
| 5,515,001 A | * | 5/1996 | Vranish | H03F 3/45475 324/123 C |
| 5,856,758 A | * | 1/1999 | Joffe | H04L 25/028 330/85 |
| 6,011,403 A | * | 1/2000 | Gillette | G01R 31/31924 324/762.02 |
| 6,028,438 A | * | 2/2000 | Gillette | G01R 31/3004 327/541 |
| 6,501,255 B2 | * | 12/2002 | Pomeroy | H03F 3/45941 330/105 |
| 6,600,366 B2 | * | 7/2003 | Ferianz | H04L 25/0278 330/69 |
| 6,756,774 B2 | * | 6/2004 | Hashimoto | H03H 7/06 323/280 |

(Continued)

*Primary Examiner* — Thomas J. Hiltunen
(74) *Attorney, Agent, or Firm* — Miller Nash LLP; Andrew J. Harrington (57) ABSTRACT

A current source has at least one gain component having a constant gain at frequencies below a frequency point, and having a gain inversely proportional to frequency at frequencies above the frequency point, the gain component having an input and an output, a source resistor connected in series with the output of the gain component, the gain component to regulate a voltage across the source resistor to be a source voltage, such that the gain of the gain component limits regulation by the gain component of the source voltage and an output voltage across a load between a high terminal and a low terminal, and a feedback component to receive at least a portion of the output voltage, the feedback component connected to the input of the gain component, the feedback component configured to reduce the gain of the gain component available to regulate the source voltage across the source resistor.

15 Claims, 9 Drawing Sheets

(56) References Cited

U.S. PATENT DOCUMENTS

| | | | | |
|---|---|---|---|---|
| 6,809,511 | B2* | 10/2004 | Akama | G01R 1/28 |
| | | | | 323/273 |
| 7,012,466 | B2* | 3/2006 | Cerisola | G05F 1/561 |
| | | | | 330/102 |
| 7,551,033 | B2* | 6/2009 | Lin | H03F 3/45183 |
| | | | | 330/253 |
| 10,003,312 | B2* | 6/2018 | Dhanasekaran | H03F 3/45071 |
| 10,491,169 | B1* | 11/2019 | Joffe | H04B 1/40 |
| 11,018,630 | B2* | 5/2021 | Joyce | H03F 3/72 |
| 2013/0272314 | A1* | 10/2013 | Kuipers | H04L 47/52 |
| | | | | 370/437 |
| 2017/0063315 | A1* | 3/2017 | Dhanasekaran | H03F 1/34 |

\* cited by examiner

EXPANDED SHUNT CURRENT SOURCE

RELATED APPLICATIONS

This application is a continuation of, and claims priority to, U.S. Provisional Patent Application No. 62/878,613, filed Jul. 25, 2019, which is incorporated herein in its entirety.

FIELD

This disclosure relates to test and measurement systems, and more particularly to current sources for use in a test and measurement system.

BACKGROUND

Many different types of test and measurement systems use current and voltage sources to apply current and/or voltage to devices under test. A source measurement unit (SMU) provides one example, without limitation, and generally applies a voltage and/or a current to a device under test (DUT) coupled to the SMU. The SMU then measures the response of the DUT, such as with an ammeter or voltmeter.

A current source may generate current by applying a source voltage across a source resistance and then applying the resulting current to the DUT. However, when the source resistance is smaller than the DUT resistance, the current source responds much slower to a change in the source voltage than when the source resistance is larger than the DUT resistance. One may use an operational amplifier (op-amp), having large gain, to allow the source resistance to appear to be larger, however the op-amp gain begins to "roll off" at relatively low frequencies causing the apparent larger resistance to "roll off" as well; appearing capacitive and reducing the speed and stability of the current source. The need for ever-increasing speed of current sourcing brings this concern to the fore.

Embodiments of the disclosed apparatus and methods address shortcomings in the prior art.

DETAILED DESCRIPTION

Figure 1:
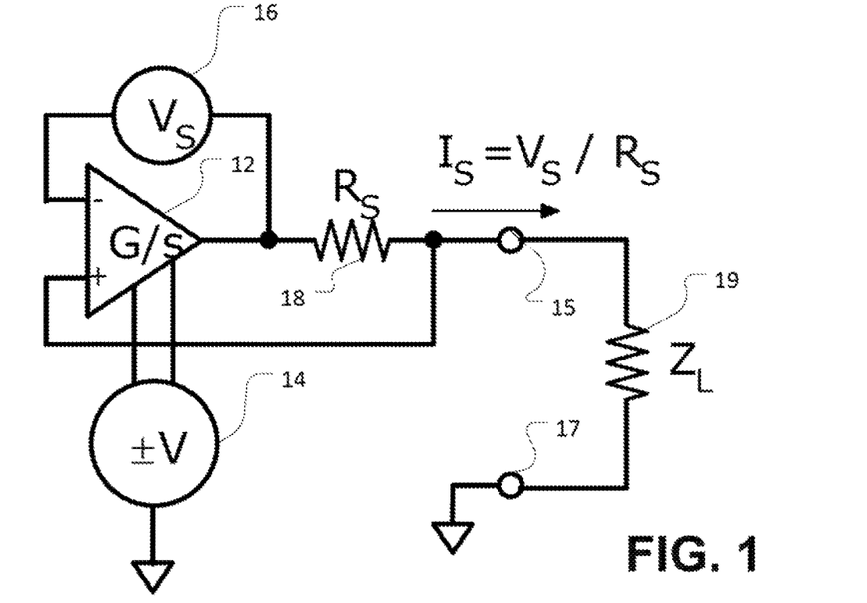
FIG. 1 shows an example of a conventional current source.

FIG. 1 shows an example of a conventional current source. In this current source, the operational amplifier (op-amp) 12, powered by the voltage 14, places the voltage $V_S$ 16 across the source resistor $R_S$ 18. This produces the output current $I_S$, which equals $V_S/R_S$. The load, represented by impedance $Z_L$ 19, lies between the high output terminal 15 and the low output terminal 17. When $Z_L$ is smaller than $R_S$, the speed at which the output current changes with changes of $V_S$ is determined by the gain bandwidth G of the op-amp. However, when $Z_L$ is greater than $R_S$, the speed reduces by the ratio of $Z_L$ to $R_S$. The general equation is $$\beta = \frac{R_S}{R_S + Z_L}.$$

For $Z_L < R_S$, $\beta \approx 1$, and for $Z_L > R_S$, $$\beta \approx \frac{R_S}{Z_L}.$$

The smaller $\beta$, the slower the current source response.

Figure 2:
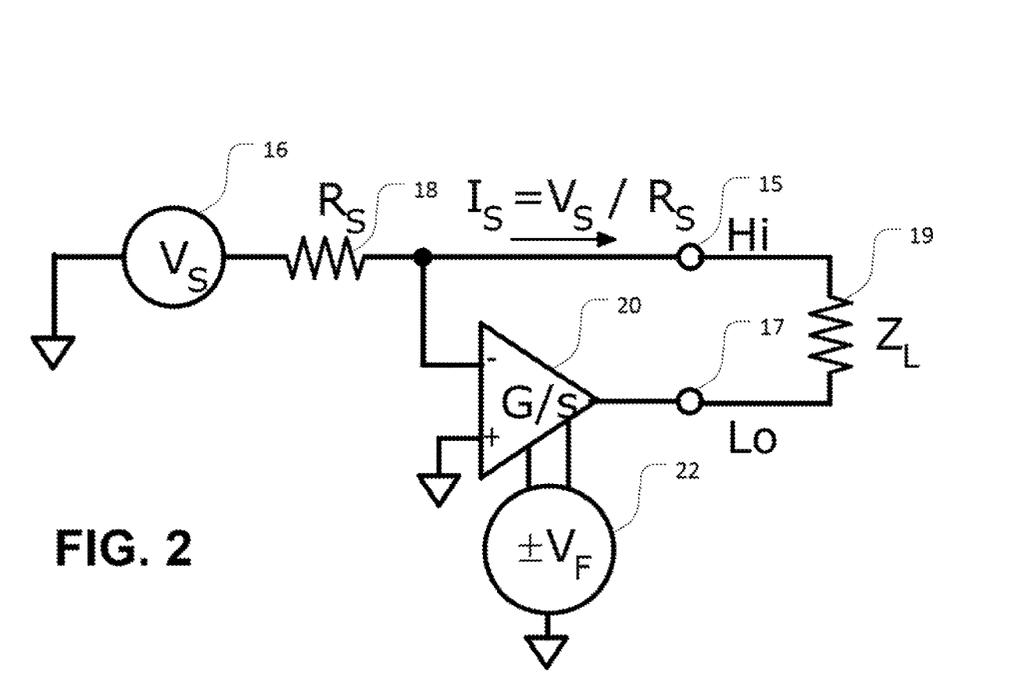
FIG. 2 shows an example of a conventional current source.

FIG. 2 shows another configuration of a conventional current source that suffers from the same issues. In this configuration, the source voltage $V_S$ 16 connects directly to the source resistor $R_S$ 18. The op-amp 20 powered by voltage 22 connects between the source resistor 18 and the low terminal 17. The load 19 lies across the high terminal 15 and the low terminal 17.

In operation, the amplifier sees a feedback term, (3, that equals the value of the source resistor dividing by the sum of the source resistor and the load resistance, $Z_L$ or:

$$\beta = \frac{R_S}{R_S + Z_L}.$$

If the load $Z_L$, is larger than the source resistor $R_S$, $\beta$ is less than 1, and the circuits of FIGS. 1 and 2 respond slowly to a change in the source voltage when in this condition. For example, if $\beta=0.1$, the current source will respond 10 times slower than if $\beta$ were equal to 1. At typical high frequency operation, this will cause a lag in circuit operation.

One possible solution could involve using a larger source resistance. However, this would require a larger source voltage to generate large currents. The power dissipated in the source resistor would increase. The embodiments here allow for reduction in the source voltage and the power dissipation while maintaining higher speeds. Essentially, the embodiments here make a lower resistance value "look" bigger, allowing for generation of higher currents at higher frequencies, while not suffering from the power dissipation or the requirement for higher voltage.

Figure 3:
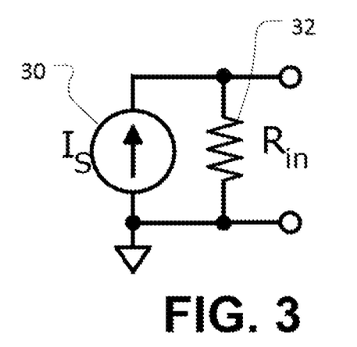
FIG. 3 shows a diagram of a Norton model of a current source.

Norton's theorem, also known as the Mayer-Norton theorem, holds that any linear electrical network with voltage and current sources and only resistances can be replaced at the high and low terminals by an equivalent current source in parallel connection with an equivalent resistance. FIG. 3 shows this model as the current source $I_S$ 30 in parallel with the resistance $R_{in}$ 32.

The embodiments here employ an attenuator to limit the gain of the gain component. The embodiments here show op amps, but any gain component could be used, including transistors. The dimensions, or values, of the other components rely, at least in part, on the gain of the gain component. The gain components used here have a gain at lower frequencies that is larger than the gain at higher frequencies. As used here the term "lower frequencies" refers to the frequencies at which the gain of the gain component is constant. The term "higher frequencies" refers to the frequencies at which the gain of the gain component is inversely proportional to the frequency.

Figure 4:
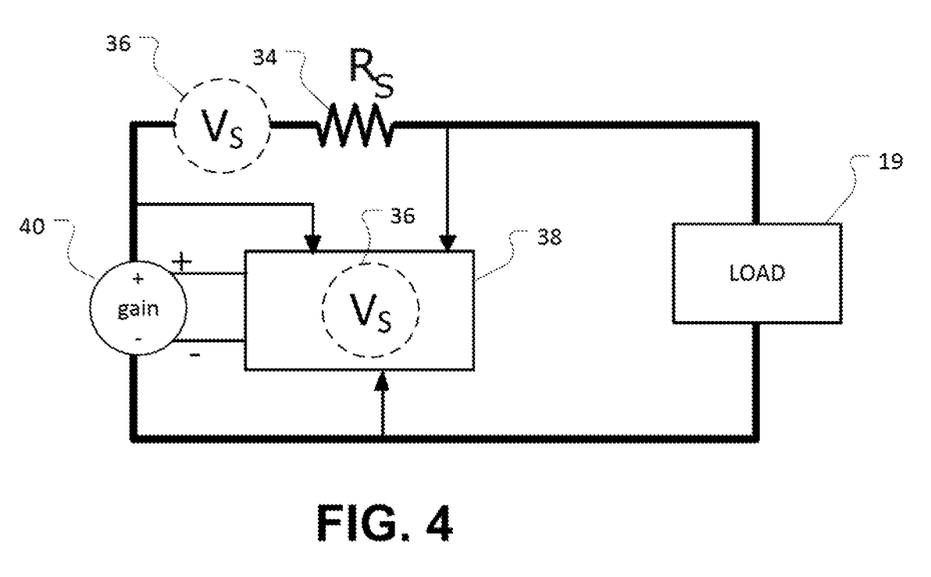
FIG. 4 shows a general schematic of an embodiment of a current source having a gain component in a feedback path.

FIG. 4 shows a schematic for an embodiment of a current source. The current source has a source voltage 36, which may reside in series with the source resistor $R_S$ 34 or may reside in the gain component feedback component at 38. The feedback component 38 reduces the gain of the gain component 40. The gain component 40 has a positive and a negative input and has an output terminal and a return terminal. The gain component 40 has a constant gain at frequencies below a frequency point above which the gain becomes inversely proportional to frequency. The gain component 40 regulates the voltage across the source resistor 34 to be the source voltage 36. The gain of the gain component 40 limits the regulation of the output voltage across a load 19 between a high terminal and a low terminal. The feedback component 38 receives at least a portion of the current source output voltage connected to the input of the gain component, and the feedback component reduces the gain of the gain component available to regulate the source voltage across the source resistor.

The embodiments here allow the regulating gain to maintain its constant gain to a higher frequency, thereby maintaining an increased current source resistance to the same higher frequency. In addition, an inductor, $L_S$, can be added in series with $R_S$, sized to $L_S = R_S k/G$, where k is a gain set by the attenuator and G is the amplifier gain-bandwidth. In the examples below, without limitation and only for ease of discussion, k will be assumed to be 10.

Figure 5:
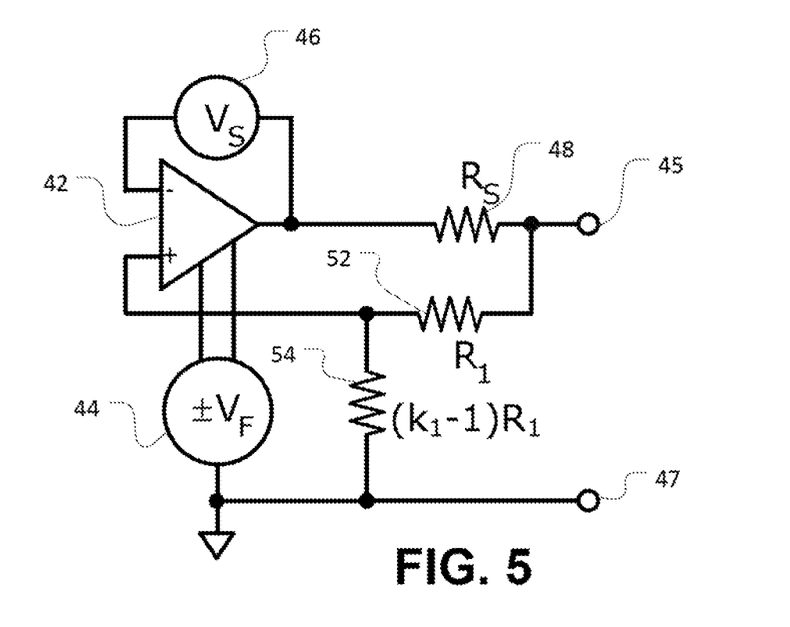
FIGS. 5-6 show embodiments of a current source having a Norton model across a wide range of frequencies.

FIG. 5 shows an embodiment of a current source incorporating an attenuator, $$\frac{R_2}{R_1 + R_2}$$

to reduce the gain of the gain components. While the figures show particular current source architectures and gain components, one should note that the embodiments apply to any current source, just as they may employ any gain component.

In the embodiment of FIG. 5, the current source has a voltage source 46 connected to the negative input of an op-amp 42, powered by voltage 44. The output of the op-amp 42 connects to the source resistor $R_S$ 48, also referred to as the current limiting resistor. The other input of the op-amp 42 connects to the output of the attenuator, which acts as a gain-reducing feedback component. In this embodiment, the attenuator comprises two resistors, 52 and 54. Resistor 54 connects between the positive input of the op-amp 42 and the low terminal 47, and resistor $R_1$ 52 connects between the positive input of the op-amp and the high terminal 45. The load is not shown here but would reside between the high and low terminals 45 and 47. As discussed above, one selects $k_1$ using the attenuator where resistor 54 temporarily referred to as $R_2$, equals $(k-1)R_1$, $$k = \frac{R_1 + R_2}{R_1}.$$

Using the discussion value of k as 10, if $R_1$ is 1K Ohms, then $R_2$ is 9K Ohms.

Figure 6:
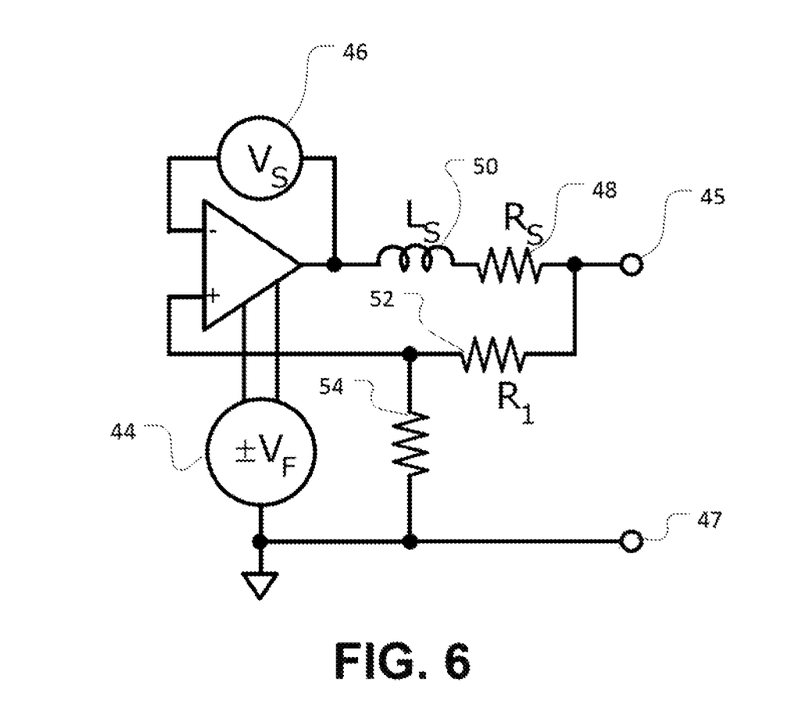

FIG. 6 shows an embodiment in which the circuit includes the resistor network, as discussed above with respect to FIG. 5, and an inductor 50 As mentioned above, the inductor has a size of $L_S = R_S k/G$, where k is a gain set by the attenuator and G is the amplifier gain-bandwidth. This extends the frequencies over which the current source holds its resistance.

Figure 7:
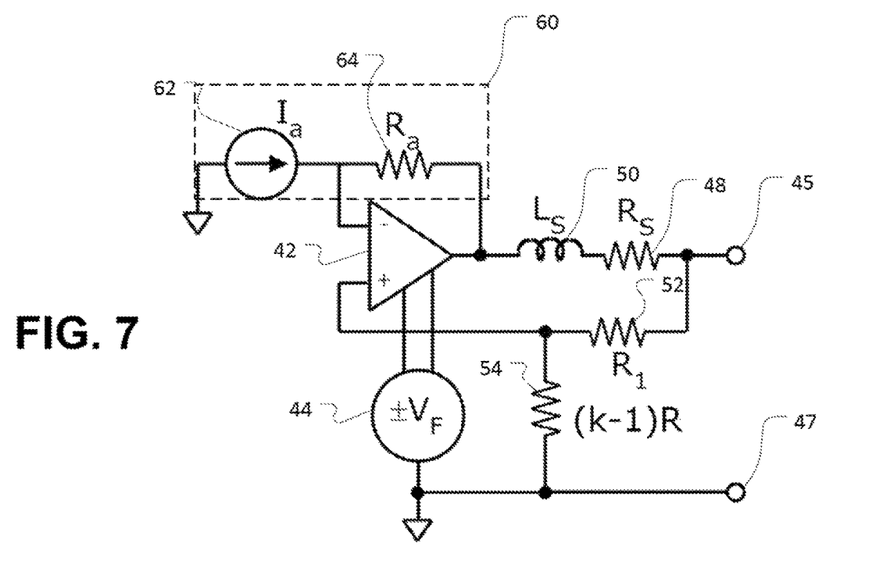
FIG. 7 shows an embodiment similar to FIG. 6 with an alternative voltage source.

FIG. 7 shows an architecture similar to that in FIG. 6 but with an alternative voltage source. In this embodiment, the voltage source 60 comprises a current source, $I_a$, 62 and a current resistor, $R_a$, 64. The source voltage equals the current multiplied by the resistor, $V_S = I_a R_a$, and the source current is the quantity of the current source multiplied by the current resistor divided by the source resistor, $I_s = I_a R_a / R_s$.

Figure 8:
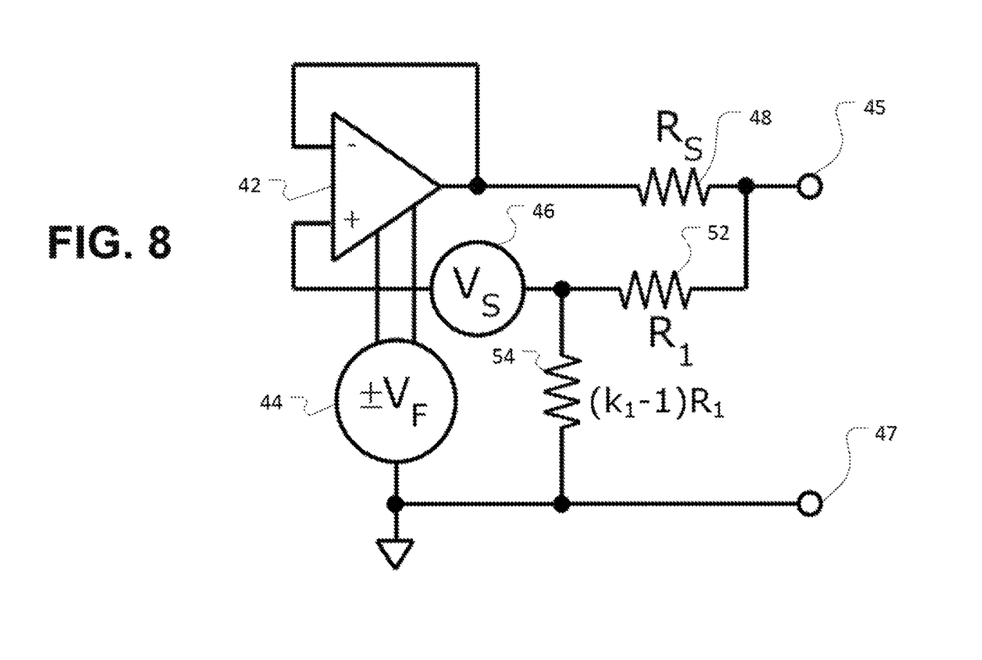
FIG. 8 shows an embodiment similar to FIG. 5 with an alternative voltage source.

FIG. 8 shows an architecture similar to that in FIG. 5, but the voltage source has been moved to be connected between the positive input of the amplifier 42, and the intermediate node of the resistor attenuator network.

Figure 9:
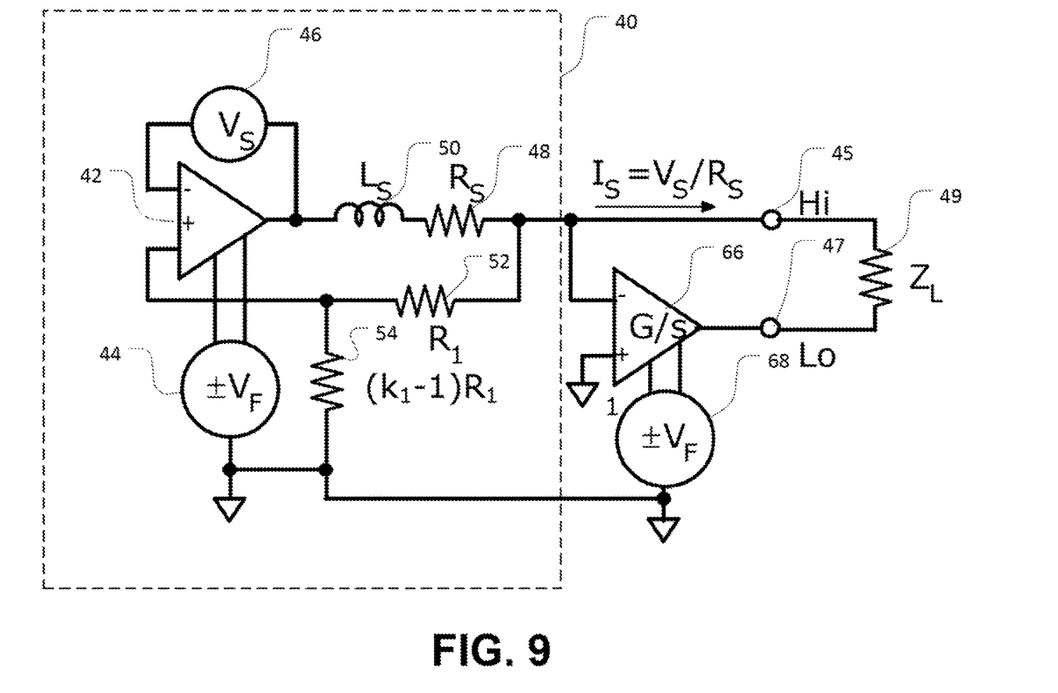
FIG. 9 shows an embodiment of FIG. 4 nested with a conventional current source of FIG. 2.

FIG. 9 shows an embodiment of a current source 40 of FIG. 6 nested with the current source in FIG. 2 that does not have gain reduction. In this embodiment, a voltage source 46 is connected to one input of an op-amp 42, powered by voltage 44. The output of the op-amp 42 is connected to an inductor $L_S$ 50, which is in turn connected to the source resistor $R_S$ 48. The other input of the op-amp 42 is connected to a resistor network as the gain reducing feedback component. In this embodiment, the resistor network comprises two resistors, 52 and 54. Resistor 54 connects between the input of the op-amp 66 and the ground, and resistor 52 connects between the input of the op-amp and the high terminal 45. The load 49 lies between the high and low terminals 45 and 47, respectively.

In this embodiment, the second op-amp 66 powered by voltage 68 connects between the source resistor on a side 'opposite' to the inductor and ground, i.e. the output of current source 80, with its output connected to the low terminal 47. The second op-amp 66 interacts with the load to keep the summing node/output at ground in this embodiment. These architectures are merely examples and could be altered but still fall within the scope of the claims below.

Figure 10:
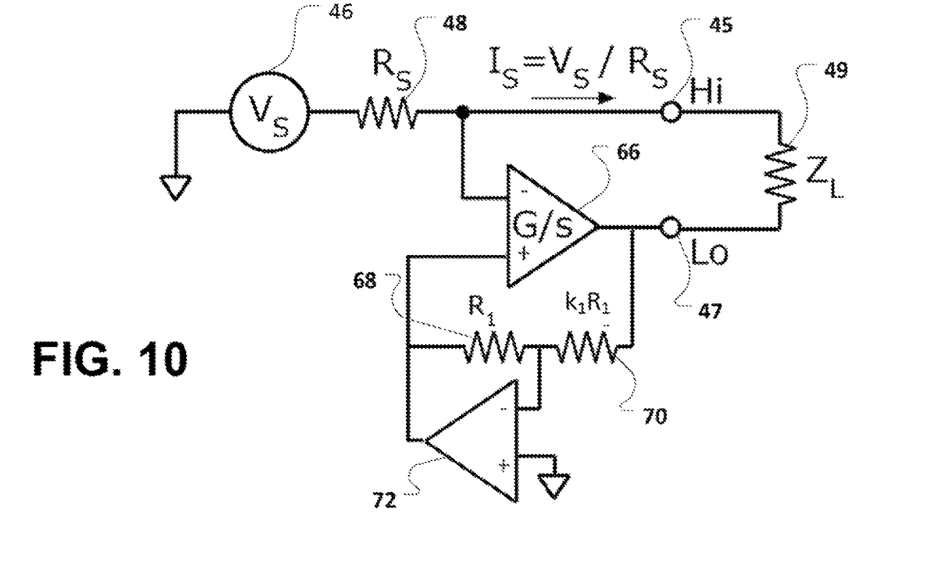
FIGS. 10-12 show embodiments similar to FIG. 2, alternatively gain reduced and alternative locations of a voltage source.
Figure 11:
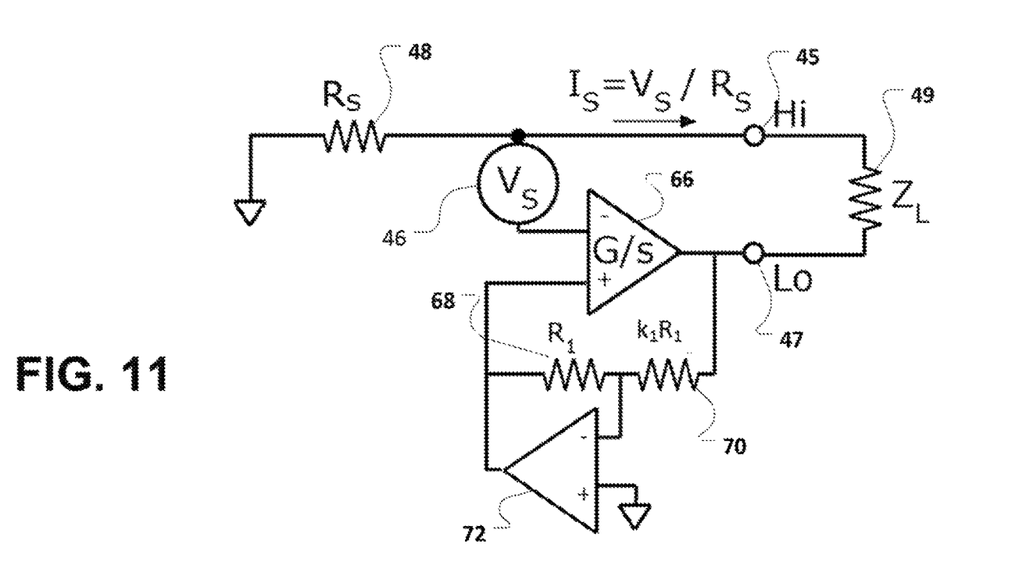
Figure 12:
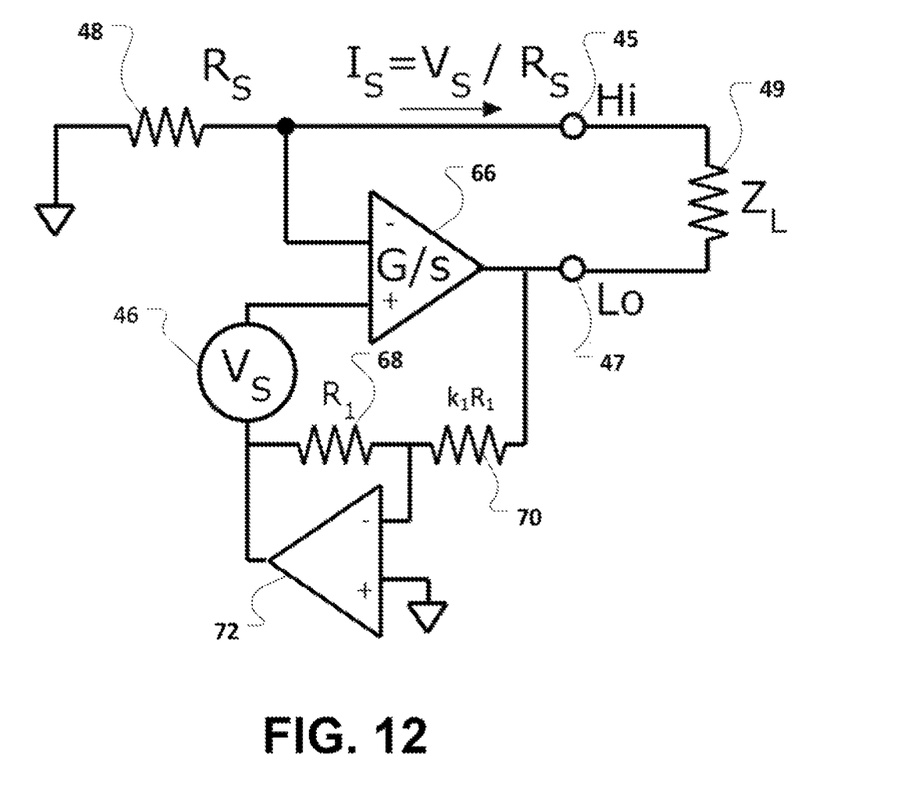

FIGS. 10-12 show embodiments similar to FIG. 2, but the op-amp 66 has a gain reduction feedback component in the form of $R_1$ 68 and $kR_1$ 70 and the gain component 72. The gain feedback is inverted in FIGS. 10-12 so the value of 70 is $k_1 R_1$ rather than $(k_1 - 1)$. The voltage source 46 of FIG. 10 connects to the source resistor 48 as in previous embodiments. In FIG. 11, the voltage source is moved to be on the other side of the source resistor 48 and connects to the negative input terminal of the op-amp 66. In FIG. 12, the voltage source 46 connects between the gain reduction feedback circuit and the positive terminal of the op-amp 66.

Figure 13:
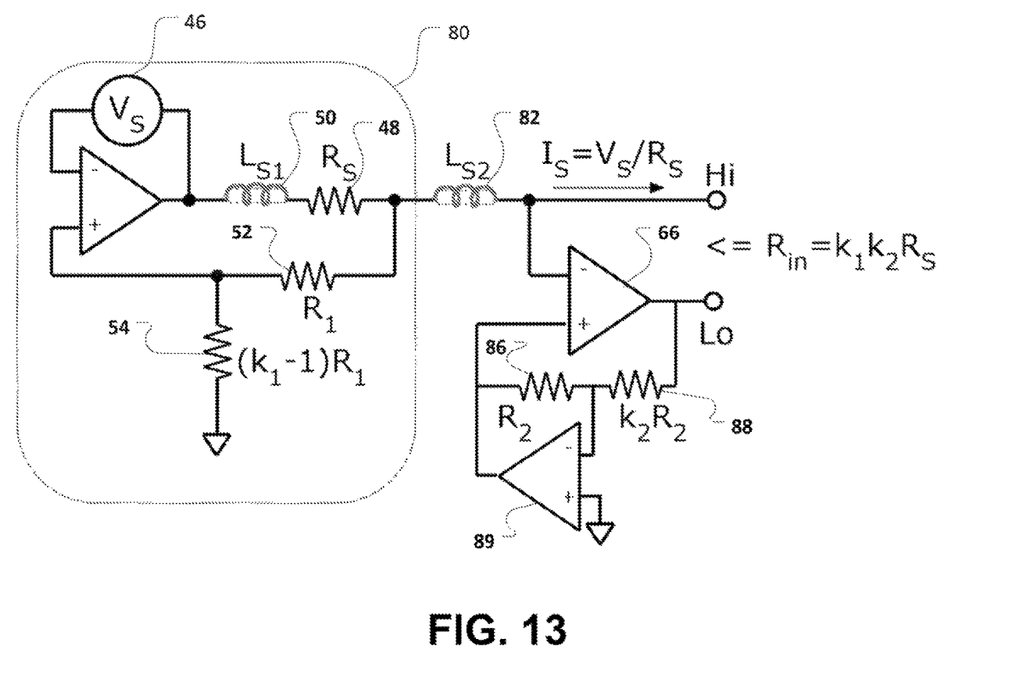
FIG. 13 shows an embodiment of nested gain-reduced current sources.

FIG. 13 shows an embodiment of nested current sources each having gain reduction. The current source with gain reduction in shown in the box 80, replacing the source voltage and the source resistor of the right hand side of the schematic. A second inductor 82 connects that current source to make it part of the left hand current source comprising the amplifier 66, with the gain reduction of the resistors $R_2$ 86 and $R_3$ 88, where $R_3$ equals $k2R_2$, and the amplifier 89. The two constants $k_1$ and $k_2$ are not related to each other, but each constant is related to the gain of each current source.

In any of the embodiments, as well as alternative architectures employing the attenuator, the current source $I_S$ behaves as if the resistor network is a small resistor, using less power and generating less heat, but allowing generation of larger currents. Similarly, the attenuator may comprise the resistor network, the inductor or the combination of the two.

The feedback, β, discussed above in these embodiments becomes the constant k multiplied by the source resistance divided by the sum of k times the source resistance and the load resistance, $$\beta = \frac{kR_S}{kR_S + Z_L}$$

Before the value of $Z_L$ can reduce β significantly, $Z_L$ must be k times larger. In the event that $Z_L$ reaches that value, the speed of the response is still k times faster than it would be without the inductor and resistor network.

Figure 14:
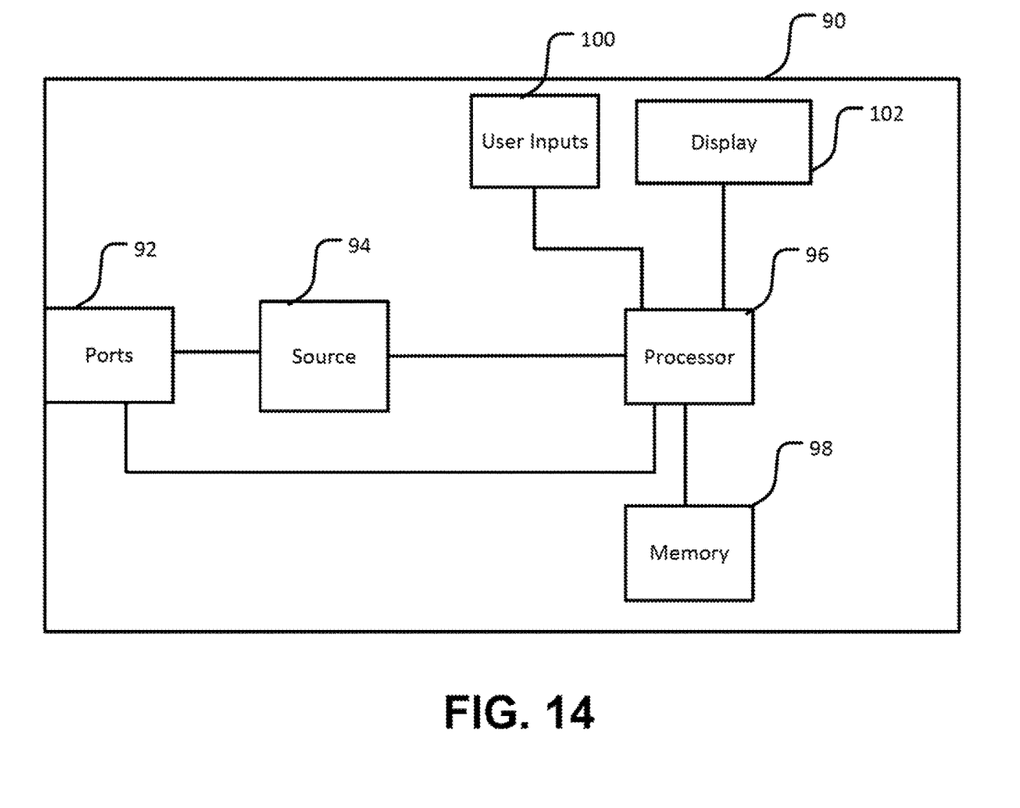
FIG. 14 shows a test and measurement device that includes a current source.

In the arena of test and measurement systems, a test and measurement instrument may include a current source within it to allow the system to apply current to a device under test. FIG. 14 shows a block diagram of one embodiment of a test and measurement instrument. As will readily be understood by one skilled in the art, the test and measurement instrument 90 may include additional components not illustrated in FIG. 14.

The test and measurement instrument 90 includes a one or more ports 92, which may be any electrical signaling medium. The test and measurement instrument 90 may be any device that may generate and then take measures of a device under test, such as, but not limited to, a current source, a source measure unit, or a digital multi-meter, as discussed above. Ports 92 may include receivers, transmitters, and/or transceivers. The ports 92 may be coupled to a source or combination of source and ammeter 94, which may include any of the current sources previously discussed. Although only one processor 96 is shown in FIG. 14 for ease of illustration, as will be understood by one skilled in the art, multiple processors 96 of varying types may be used in combination, rather than a single processor 96. The processor 96 may be electrically coupled to the source 94 to assist with measuring, displaying, and/or storing the current of a connected device under test.

The one or more processors 96 may be configured to execute instructions from memory 98 and may perform any methods and/or associated steps indicated by such instructions. Memory 98 may be implemented as processor cache, random access memory (RAM), read only memory (ROM), solid-state memory, hard disk drive(s), or any other memory type. Memory 98 acts as a medium for storing data, computer program products, and other instructions.

User inputs 100 are coupled to the one or more processors 98. User inputs 100 may include a keyboard, mouse, trackball, touchscreen, and/or any other controls employable by a user to with a GUI on the display 102. The display 102 may be a digital screen, a cathode ray tube based display, or any other monitor to display waveforms, measurements, and other data to a user. While the components of test and measurement instrument 90 are depicted as being integrated within test and measurement instrument 90, it will be appreciated by one of ordinary skill in the art that any of these components can be external to test instrument 90 and can be coupled to test instrument 90 in any conventional manner, such as wired and/or wireless communication media and/or mechanisms. For example, in some embodiments, the display 92 may be remote from the test and measurement instrument 90.

The embodiments discussed herein allow for a wide dynamic range of electrical currents with accuracy at all electrical current levels. The embodiments may allow a user to accurately measure a device at both low and high electrical currents, without having to change the ammeter. For example, if a device were to suddenly receive a large electrical current, while previously receiving a low electrical current, the ammeter of the embodiments disclosed herein are capable of sourcing both the low electrical currents and the high electrical currents with accuracy.

In this disclosure, the singular forms "a," "an," and "the" include plural referents unless the context dictates otherwise. The term "or" is meant to be inclusive and means either, any, several, or all of the listed items. The terms "comprises," "comprising," "includes," "including," or other variations thereof, are intended to cover a non-exclusive inclusion such that a process, method, or product that comprises a list of elements does not necessarily include only those elements, but may include other elements not expressly listed or inherent to such a process, method, article, or apparatus. Relative terms, such as "about," "approximately," "substantially," and "generally," are used to indicate a possible variation of ±10% of a stated or understood value.

The aspects of the present disclosure are susceptible to various modifications and alternative forms. Specific aspects have been shown by way of example in the drawings and are described in detail herein. However, it should be noted that the examples disclosed herein are presented for the purposes of clarity of discussion and are not intended to limit the scope of the general concepts disclosed to the specific aspects described herein unless expressly limited. As such, the present disclosure is intended to cover all modifications, equivalents, and alternatives of the described aspects in light of the attached drawings and claims.

References in the specification to aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described in connection with a particular aspect, such feature, structure, or characteristic can be employed in connection with another disclosed aspect whether or not such feature is explicitly described in conjunction with such other disclosed aspect.

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid-state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the disclosed technologies are provided below. An embodiment of the technologies may include one or more, and any combination of, the examples described below.

Example 1 is a current source, comprising: at least one gain component having a constant gain at frequencies below a frequency point, and having a gain inversely proportional to frequency at frequencies above the frequency point, the gain component having an input and an output; a source resistor connected in series with the output of the gain component, the gain component to regulate a voltage across the source resistor to be a source voltage, such that the gain of the gain component limits regulation by the gain component of the source voltage and an output voltage across a load between a high terminal and a low terminal; and a feedback component to receive at least a portion of the output voltage, the feedback component connected to the input of the gain component, the feedback component configured to reduce the gain of the gain component available to regulate the source voltage across the source resistor.

Example 2 is the current source of Example 1, further comprising an inductance in series with the source resistor, the inductance sized to have an impedance equal to the resistance of the source resistor at the frequency point.

Example 3 is the current source of either of Examples 1 or 2, wherein the gain component comprises an operational amplifier.

Example 4 is the current source of any of the Examples 1-3, wherein the feedback component comprises a resistive attenuator across the output.

Example 5 is the current source of any of the Examples 1-4, where the feedback component comprises an inverting attenuator.

Example 6 is the current source of any of the Examples 1-5, wherein the current source is inserted in place of a source resistor of a second current source, without gain reduction.

Example 7 is the current source of any of the Examples 1-6, wherein the current source is inserted in place of a source resistor of a second current source with gain reduction.

Example 8 is the current source, comprising: a source voltage; at least one gain component having a constant gain at frequencies below a frequency point, and having a gain inversely proportional to frequency at frequencies above the frequency point, the gain component having an input and an output; a source resistor connected to the output of the gain component; and a resistor network connected between the source resistor and the input of the gain component, the resistor network comprised of at least two resistors related by a constant based upon a gain.

Example 9 is the current source of Example 8, wherein the gain component comprises an operational amplifier.

Example 10 is the current source of Example 9, further comprising a second operational amplifier connected between a high terminal and a low terminal of the current source.

Example 11 is the current source of any of Examples 8-10, further comprising an inductor in series with the source resistor.

Example 12 is a method of generating a current, comprising: providing power to at least one gain component having a constant gain at frequencies below a frequency point, and having a gain inversely proportional to frequency at frequencies above the frequency point, the gain component having an input and an output; connecting a source resistor in series with the output of the gain component, the gain component to regulate a voltage across the source resistor to be a source voltage, such that the gain of the gain component limits the regulation of the source voltage and an output voltage across a load between a high terminal and a low terminal; and producing a feedback signal from a feedback component comprising at least a portion of the output voltage connected to the input of the gain component, the feedback signal to reduce the gain of the gain component available to regulate the source voltage across the source resistor.

Example 13 is the method of Example 12, wherein producing the feedback signal from the feedback component comprises producing the feedback signal from a resistor network having a first and second resistor that have values that are proportional to each other.

Example 14 is the method of Example 13, wherein a value of the second resistor is equal to a constant minus one, times a value of the first resistor.

Example 15 is the method of Example 14, further comprising connecting an inductor in series with the source resistor, and selecting the constant based upon a point where a frequency response of the inductor equals the resistance of the source resistor.

Example 16 is the method of any of Examples 13-15, wherein producing the feedback signal further comprises producing the feedback signal from an additional gain component comprising an operational amplifier.

Example 17 is the current source of any of Examples 12-16, wherein producing the feedback signal comprises from the feedback component comprises producing the feedback signal from an operational amplifier between the high and low terminals.

Example 18 is the current source of any Examples 12-17, further comprising connecting an inductor in series with the source resistor.

Although specific embodiments have been illustrated and described for purposes of illustration, it will be understood that various modifications may be made without departing from the spirit and scope of the disclosure. Accordingly, the invention should not be limited except as by the appended claims.

The invention claimed is:

1. A current source, comprising:
    at least one gain component having a constant gain at frequencies below a frequency point, and having a gain inversely proportional to frequency at frequencies above the frequency point, the gain component having a first input, a second input, and an output;
    a source resistor connected in series with the output of the gain component and connected to a high terminal of a current source output, the gain component configured to regulate a voltage across the source resistor to be a source voltage, the gain of the gain component limiting regulation by the gain component of the source voltage and an output voltage across a load between the high terminal and a low terminal of the current source output;
    an inductance in series with the source resistor, the inductance sized to have an impedance equal to the resistance of the source resistor at the frequency point to extend a range of frequencies over which the current source holds a resistance; and
    a feedback component connected to the low terminal and an input of the gain component, the feedback component to receive at least a portion of the output voltage the feedback component configured to reduce the gain of the gain component available to regulate the source voltage across the source resistor to make the source resistor appear larger than a load resistance between the high and low terminals.

2. The current source as claimed in claim 1, wherein the gain component comprises an operational amplifier.

3. The current source as claimed in claim 1, wherein the feedback component comprises a resistive attenuator across the output.

4. The current source as claimed in claim 1, where the feedback component comprises an inverting attenuator.

5. The current source as claimed in claim 1, wherein the current source is inserted in place of a source resistor of a second current source without gain reduction.

6. The current source as claimed in claim 1, wherein the current source is inserted in place of a source resistor of a second current source with gain reduction.

7. A current source, comprising:
    a source voltage;
    at least one gain component having a constant gain at frequencies below a frequency point, and having a gain inversely proportional to frequency at frequencies above the frequency point, the gain component having a first input connected to the source voltage and an output connected to a high output terminal;
    a source resistor connected to the output of the gain component and the high output terminal, the gain component configured to regulate a voltage across the source resistor to be a source voltage, the gain of the gain component limiting regulation by the gain component of the source voltage and an output voltage across a load between the high output terminal and a low output terminal; and
    a resistor network comprising two resistors in series, a first end of the network connected to the high output terminal and a second end connected to the low output terminal and a node between the two resistors connected to a second input of the gain component, values of the two resistors are different but related by a constant that is the gain of the gain component set by the resistor network.

8. The current source of claim 7, wherein the gain component comprises an operational amplifier.

9. The current source as claimed in claim 8, further comprising a second operational amplifier connected between a high terminal and a low terminal of the current source.

10. The current source of claim 7, further comprising an inductor in series with the source resistor.

11. A method of generating a current, comprising:
    providing power to at least one gain component having a constant gain at frequencies below a frequency point and having a gain inversely proportional to frequency at frequencies above the frequency point, the gain component having a first input, a second input and an output;
    connecting a source resistor in series with the output of the gain component, the gain component to regulate a voltage across the source resistor to be a source voltage, such that the gain of the gain component limits the regulation of the source voltage and an output voltage across a load between a high terminal and a low terminal; and
    producing a feedback signal from a feedback component comprised of a resistor network having a first resistor and a second resistor, a value of the second resistor is equal to a constant minus one times a value of the first resistor and the constant is the gain of the gain component set by the resistor network connected between the low terminal and the second input of the gain component, the feedback signal comprising at least a portion of the output voltage connected to the input of the gain component, the feedback signal to reduce the gain of the gain component available to regulate the source voltage across the source resistor to make the source resistor appear larger than a load resistance.

12. The method as claimed in claim 11, further comprising connecting an inductor in series with the source resistor, and selecting the constant based upon a point where a frequency response of the inductor equals the resistance of the source resistor.

13. The method as claimed in claim 11, wherein producing the feedback signal further comprises producing the feedback signal from an additional gain component comprising an operational amplifier.

14. The current source as claimed in claim 11, wherein producing the feedback signal comprises from the feedback component comprises producing the feedback signal from an operational amplifier between the high and low terminals.

15. The current source as claimed in claim 11, further comprising connecting an inductor in series with the source resistor.

\* \* \* \* \*